United States Patent
Chan et al.

(10) Patent No.: US 7,897,901 B2
(45) Date of Patent: Mar. 1, 2011

(54) ULTRA LOW VOLTAGE CMOS IMAGE SENSOR ARCHITECTURE

(75) Inventors: Man Sun John Chan, Hong Kong (CN); Chen Xu, San Jose, CA (US); Wing Hung Ki, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 0 days.

(21) Appl. No.: 12/059,402

(22) Filed: Mar. 31, 2008

(65) Prior Publication Data

US 2008/0237447 A1   Oct. 2, 2008

Related U.S. Application Data

(60) Continuation of application No. 11/340,676, filed on Jan. 27, 2006, which is a division of application No. 10/219,260, filed on Aug. 16, 2002, now Pat. No. 7,005,626.

(51) Int. Cl.
*H01L 27/00* (2006.01)
*H01J 40/14* (2006.01)

(52) U.S. Cl. ............... 250/208.1; 250/214 R; 257/290; 348/308

(58) Field of Classification Search ........... 250/208.1, 250/214 R, 214 A; 257/209–292, 431, 443, 257/444; 348/294, 296, 301, 308
See application file for complete search history.

(56) References Cited

U.S. PATENT DOCUMENTS

| | | | |
|---|---|---|---|
| 5,965,871 A | * | 10/1999 | Zhou et al. ............ 250/208.1 |
| 6,021,172 A | | 2/2000 | Fossum et al. |
| 6,130,713 A | | 10/2000 | Merrill |
| 6,140,630 A | * | 10/2000 | Rhodes .................. 250/208.1 |
| 6,215,113 B1 | | 4/2001 | Chen et al. |
| 6,380,572 B1 | | 4/2002 | Pain et al. |
| 6,429,413 B1 | | 8/2002 | Kawahara et al. |
| 6,583,440 B2 | | 6/2003 | Yasukawa |
| 6,587,145 B1 | | 7/2003 | Hou |
| 6,590,610 B2 | | 7/2003 | Castro et al. |
| 2003/0107666 A1 | | 6/2003 | Harton et al. |

OTHER PUBLICATIONS

Office Action, mailed Jun. 7, 2004 for U.S. Appl. No. 10/219,260.
Office Action, mailed Jan. 31, 2005 for U.S. Appl. No. 10/219,260.
Office Action, mailed Jul. 11, 2005 for U.S. Appl. No. 10/219,260.
Notice of Allowance, mailed Oct. 19, 2005 for U.S. Appl. No. 10/219,260.
Office Action, mailed Jan. 17, 2007 for U.S. Appl. No. 11/340,676.
Office Action, mailed Apr. 7, 2008 for U.S. Appl. No. 11/340,676.

(Continued)

*Primary Examiner*—Kevin Pyo
(74) *Attorney, Agent, or Firm*—Schwabe, Williamson & Wyatt

(57) ABSTRACT

A pixel element for an image sensor comprising, a photodiode and a reset transistor coupled to an input node, wherein said reset transistor is a PMOSFET coupled between said input node and the supply voltage, and wherein said pixel further comprises parallel complementary signal paths.

21 Claims, 7 Drawing Sheets

OTHER PUBLICATIONS

Office Action, mailed Sep. 17, 2008 for U.S. Appl. No. 11/340,676.
Office Action, mailed Jan. 7, 2009 for U.S. Appl. No. 11/340,676.
Final Office Action, mailed Jul. 21, 2009, for U.S. Appl. No. 11/340,676.
Office Action, mailed Dec. 14, 2009, for U.S. Appl. No. 11/340,676, 8 pages.
Final Office Action, mailed Jun. 7, 2010, for U.S. Appl. No. 11/340,676, 6 pages.

* cited by examiner

ULTRA LOW VOLTAGE CMOS IMAGE SENSOR ARCHITECTURE

CROSS REFERENCE TO RELATED APPLICATION

This application is a continuation of U.S. patent application Ser. No. 11/340,676, filed Jan. 27, 2006, which is a continuation-in-part of U.S. patent application Ser. No. 10/219,260, filed Aug. 16, 2002, the entire disclosure of which is incorporated into the 11/340,676 application by reference.

FIELD OF THE INVENTION

This invention relates to a novel architecture for a CMOS-based image sensor, and in particular to an architecture suitable for use at ultra-low voltages (eg below 1V).

BACKGROUND OF THE INVENTION

CMOS-based image sensors have a wide range of potential applications since they may be integrated into a number of electronic products such as personal computers, cellular telephones, personal digital assistants and many others. CMOS active pixel sensors (APS) exploit the mature CMOS industry and can compete with charge coupled devices for low power, high levels of integration and functionality.

In recent years much effort has been made into reducing the required voltage supply to facilitate the incorporation of APS devices in portable applications such as mobile phones, and personal digital assistants which all need to minimize power consumption in order to maximize battery life. However, if the voltage supply goes below 1V, this has an enormous impact on the signal-to-noise ratio and the dynamic range of the pixels, not only because of the lower allowable signal voltages, but also because of the presence of larger noise voltages due to lower currents. In order to maximize the signal-to-noise ratio and dynamic range of the pixel, the signals have to be as large as possible, preferably from rail-to-rail, and so the pixel has to be equipped with a rail-to-rail input as well as a rail-to-rail output stage.

PRIOR ART

FIG. 1(a) shows the structure of a conventional APS design. In this structure the highest available output voltage $V_{out}$ is limited by the $V_T$ drop of the NMOS reset transistor M1 and the source follower M2, and therefore the maximum available output swing is only $V_{DD}-2V_T-V_{Dsat}$ and this significantly limits the dynamic range of the CMOS APS of FIG. 1(a) as is shown in FIG. 1(b). The APS shown in FIG. 1(a) cannot function at a supply voltage of 1V or below, or at least cannot function without very complex output circuits.

The voltage output of the active pixel sensor element will have a slope which depends on the illumination intensity with the slope increasing with increasing intensity. The slope, and thus the intensity, may be extracted from the output using known double sampling (DS) or correlated double sampling (CDS) techniques. FIG. 5 illustrates a conventional CDS technique in which the voltage difference is measured over a fixed time interval. A disadvantage with a conventional CDS technique, however, is that it requires an analog-to-digital converter (ADC) capable of a very fine degree of resolution, which is quite difficult to achieve in an ultra low voltage environment. For example, with an APS capable of operating at low voltages as described further herein, at 1V operation the output swing is only 0.55V and to achieve 8-bits resolution the ADC needs to have a resolution of 2 mV. This implies that the practical dynamic range of an APS is governed not only by the APS architecture itself, but also by the readout method.

SUMMARY OF THE INVENTION

According to the present invention there is provided an optical sensor comprising at least one pixel wherein the pixel generates an output voltage that changes at a rate dependent on the light intensity incident on the pixel, and wherein means are provided for measuring the time for the pixel output voltage to change from a first predefined level to a second predefined level so as to produce an output indicative of the incident light intensity.

According to still further aspect the present invention also provides a method of generating an output from a pixel of an optical sensor wherein the pixel generates an output voltage that changes at a rate dependent on the light intensity incident on the pixel, the method comprising measuring the time for the pixel output voltage to change from a first predefined level to a second predefined level.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 1A:
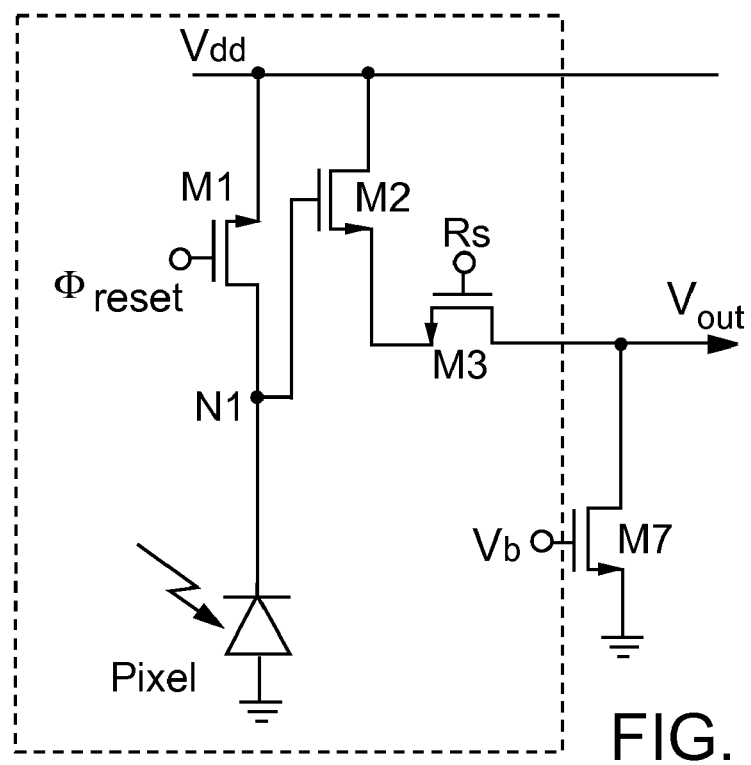
FIGS. 1(a) and (b) illustrate (a) a conventional APS architecture and (b) the available output voltage swing, FIGS. 2(a), (b) and (c) show (a) the architecture of a CMOS APS, (b) the available output voltage swing and (c) the same structure with the reset transistor changed to NMOSFET and the photodiode connected to the power supply, FIGS. 3(a) and (b) show outputs from a CMOS APS and, in FIG. 3(b) the output from the prior art by way of comparison, FIGS. 4(a), (b), (c) and (d) show cross-sectional views of four possible structures of the CMOS APS, (a) on bulk silicon with light coming from the top, (b) on SOI with light coming from the top, (c) on SOI with light coming from the bottom, and (d) on bulk silicon with light coming from the bottom after thinning the silicon substrate
Figure 2A:
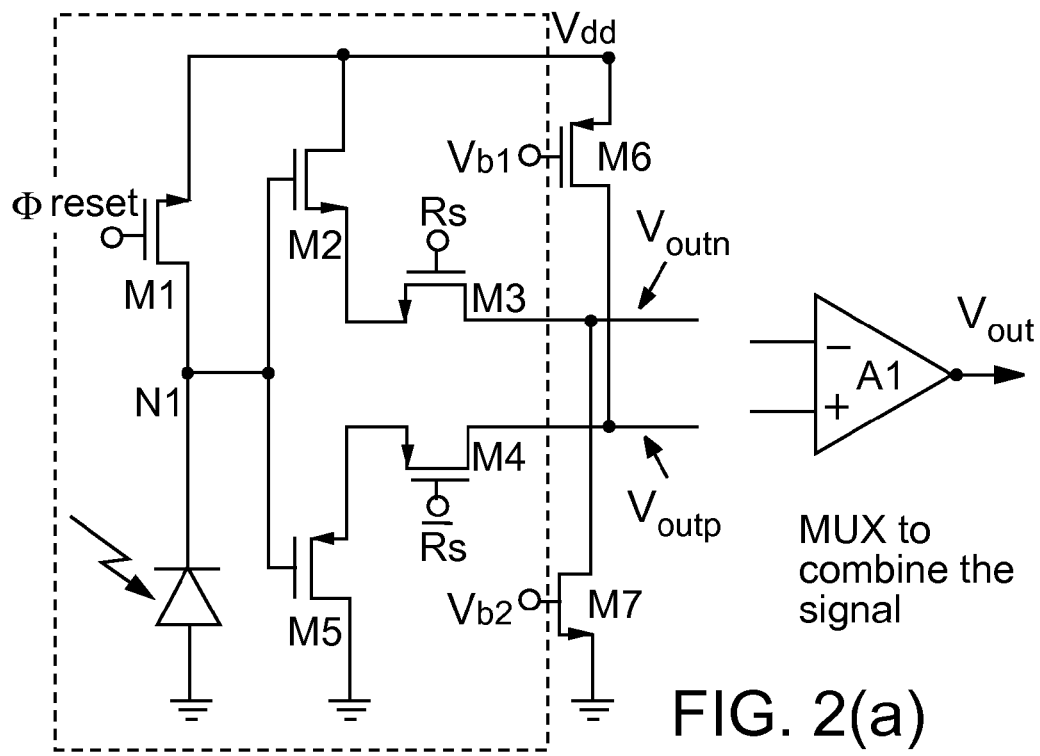

Referring firstly to FIG. 2(a) a CMOS APS will now be described. It will be understood that FIG. 2(a) shows just one pixel and in use an array of pixels may be provided. In comparison with the conventional APS architecture shown in FIG. 1(a) it will be noted that the NMOS reset transistor M1 of the prior art has been replaced by a PMOSFET reset transistor M1. This allows the input node to go all the way to $V_{DD}$ when the chip is reset. After reset, the photodiode will discharge N1 at a rate that is proportional to the incident light intensity. This signal is amplified by the source follower M2 and arrives at the node $V_{outn}$. As in the prior art M3 is a NMOS transmission gate that is provided to allow the signal to pass upon application of a row select signal. In this signal path there will be an inevitable drop $V_T$ due to the source follower M2, and to compensate for this a complementary signal path is provided comprising a PMOS common drain amplifier M5 and an associated PMOS transmission gate M4. This complementary signal path produces an output $V_{outp}$ and the two outputs ($V_{outn}$ and $V_{outp}$) are combined to give the pixel output $V_{out}$.

As mentioned above, a PMOS reset transistor is used to eliminate the threshold voltage drop between $V_{DD}$ and the node N1. In addition, two complementary source followers M2 and M5 are used to amplify the signal on node N1 and the two complementary paths are combined to give the pixel output.

The input and output swing of the NMOS source follower M2 is given by:

$$V_{dsat}+V_{TN}<V_{Ninput}<V_{DD}$$

$$V_{dsat}<V_{Noutput}<V_{DD}-V_{TN}$$

Where $V_{Ninput}$ and $V_{Noutput}$ are the input and output swings of the node N1 respectively. $V_{TN}$ is the threshold voltage of the N-type source follower M2 and $V_{dsat}$ is the voltage across the current source.

The input swing of the PMOS source follower M5 is given by:

$$0<V_{Pinput}<V_{DD}-V_{dsat}-V_{TP}$$

$$V_{TP}<V_{Poutput}<V_{DD}-V_{dsat}$$

In order to ensure a full rail-to-rail input, the supply voltage $V_{DD}$ has to be at least $V_{TN}+V_{TP}+2V_{dsat}$. At the same time, the available output swing is close to rail-to-rail:

$$V_{dsat}<V_{output}<V_{DD}-V_{dsat}$$

Figure 1B:
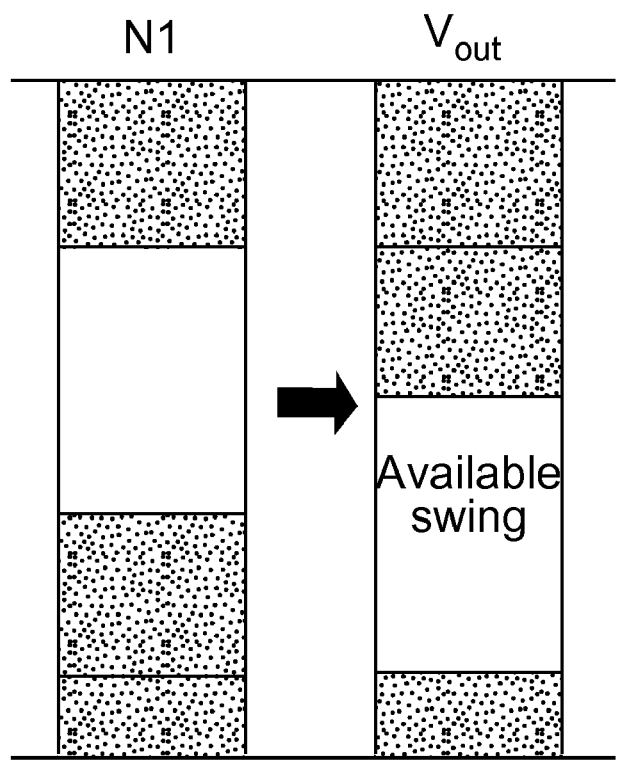
Figure 2B:
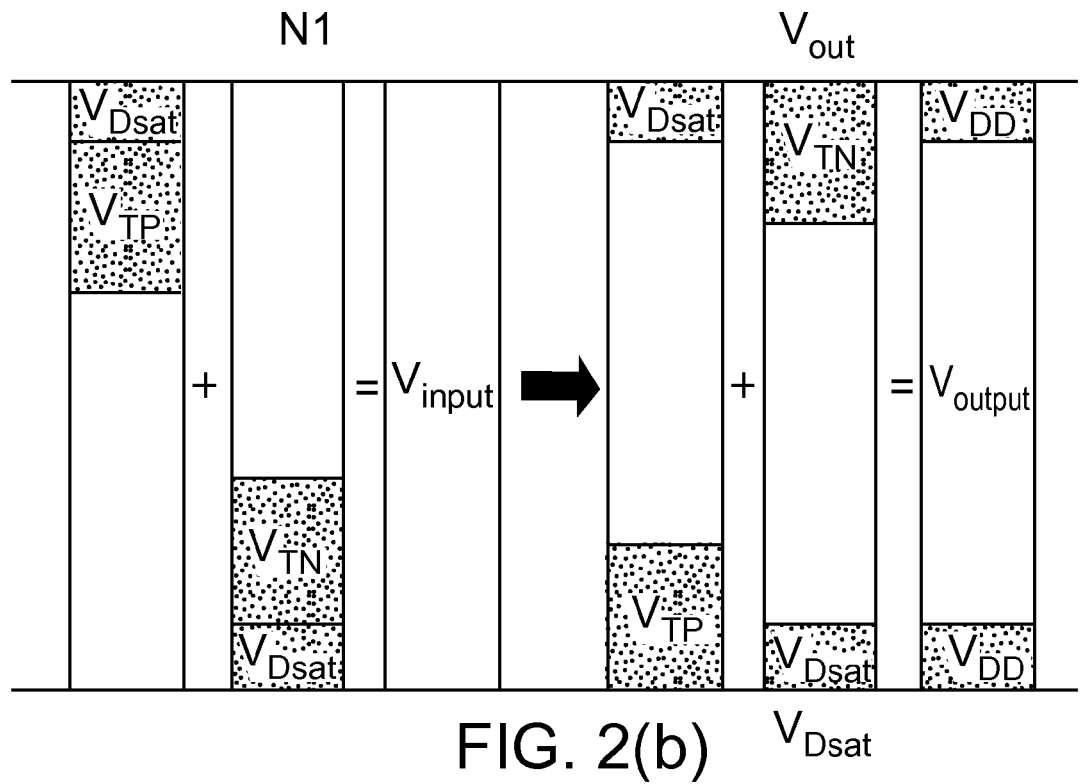

This maximum available output swing is shown schematically in FIG. 2(b) and it will be seen from a simple comparison of FIGS. 1(b) and 2(b) that the architecture of the present invention, at least in its preferred forms, provides for a much greater output swing. In particular this allows the minimum supply voltage to be reduced, for example to as low as 1.2V in 0.25 µm CMOS technology where typically $V_{TN}$=0.4V, $V_{TP}$=0.6V and $V_{dsat}$=0.1V. Furthermore if the bias transistors are operated in the triode or weak inversion mode, the supply voltage can be even lower.

Figure 2C:
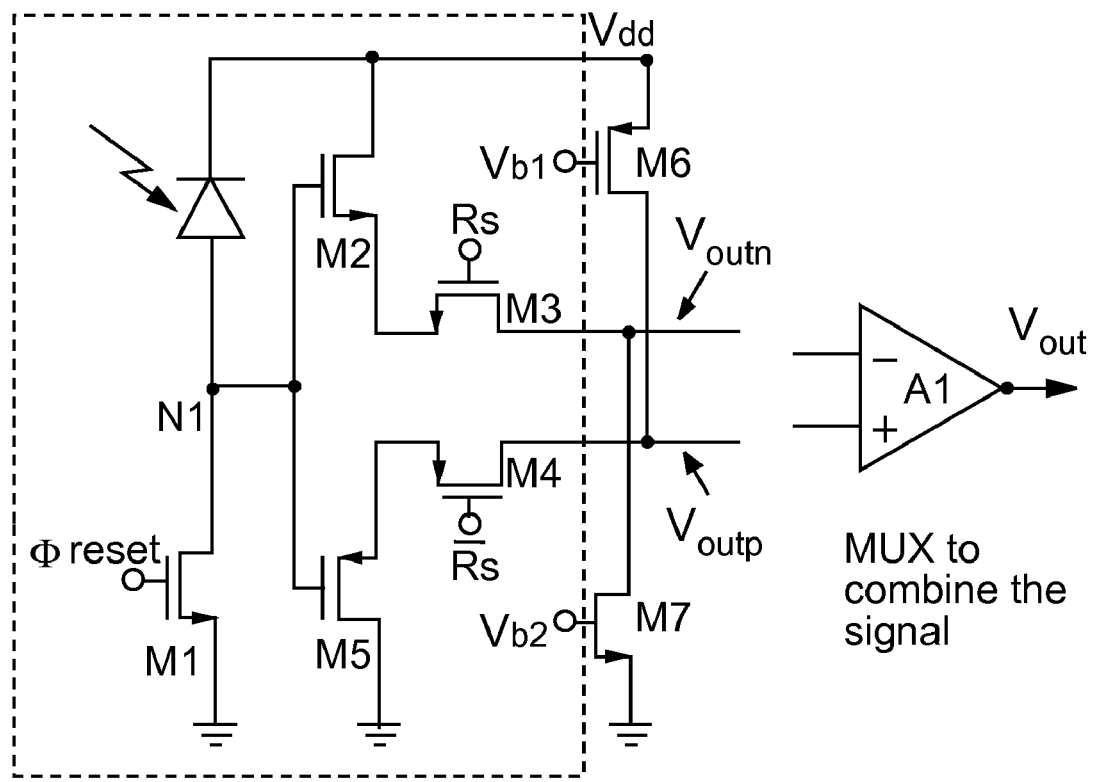

FIG. 2(c) shows the complementary structure derived from the pixel architecture given in FIG. 2(b) with the photodiode connected to the power supply voltage and the reset transistor replaced by an NMOSFET connected to ground.

Figure 3:
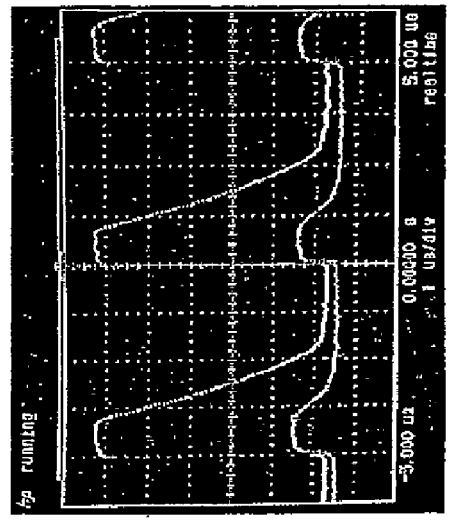
Figure 3:
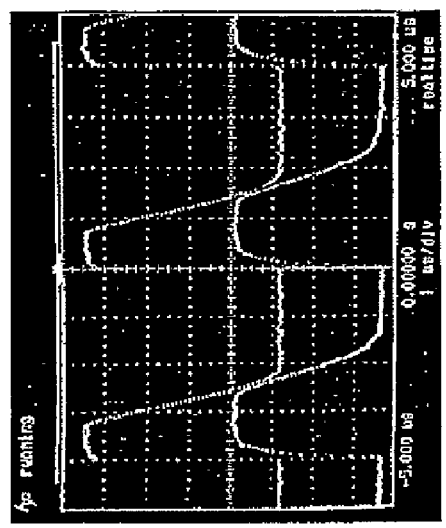

FIG. 3 illustrates experimental outputs from a CMOS APS using the TSMC [Taiwan Semiconductor Manufacturing Company]0.25 µm CMOS process with 5 metal and 1 polysilicon layer. FIG. 3(a) shows the outputs of the two complementary signal paths at a 1V supply voltage, while the output signal after their combination is shown in FIG. 3(b). FIG. 3(b) also shows a conventional trace from a prior art design (this is the lower trace in FIG. 3(b)). It can be seen from FIG. 3(b) that the design of the CMOS APS is capable of working at a 1V supply voltage, whereas the conventional prior art design is incapable of so doing.

It will also be understood that in the CMOS APA of FIG. 2(a) the reset transistor could be a NMOSFET transistor, in which case source follower M2 would be PMOS, and complementary source follower M5 would be NMOS.

Figure 4A:
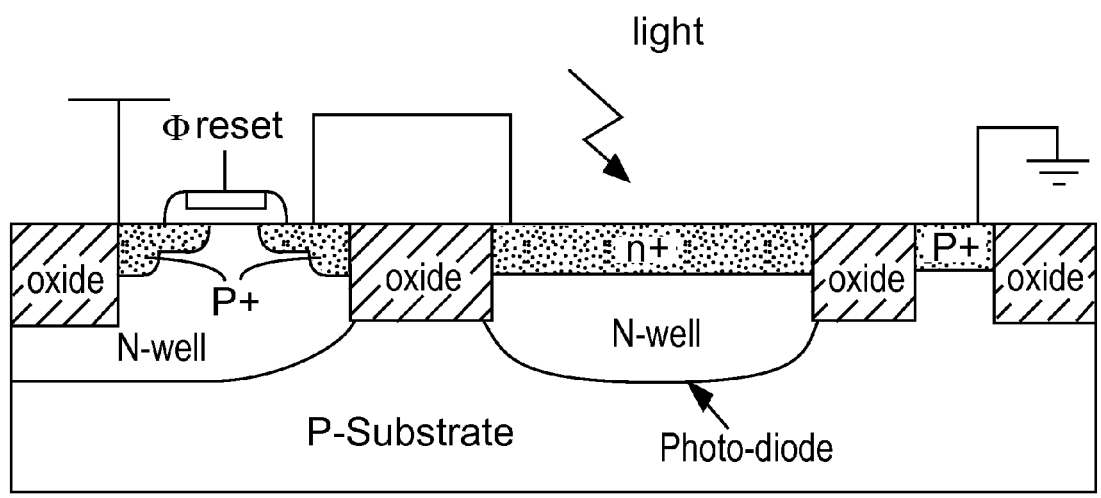
Figure 4B:
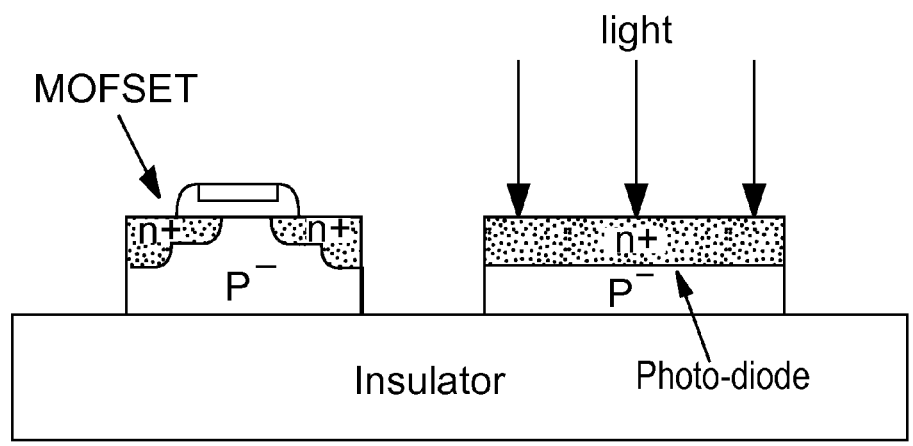

An active pixel sensor could be implemented through bulk silicon technology, but could also be implemented using silicon-on-insulator (SOI) technology. FIG. 4(a) shows an example of a device manufactured using bulk silicon technology and FIG. 4(b) shows and example of a device manufactured using SOI technology. SOI technology uses a thin layer of silicon on an insulator and all active devices are fabricated in the thin layer. Compared to bulk technology SOI technology has a number of advantages including: better isolation between pixels leading to smaller interference between pixels; SOI CMOS technology does not require a separate well for the PMOSFET and can thus provide a higher fill-factor because the transistors in the pixel can be packed closer together; and SOI can further reduce the power consumption due to the smaller loading that has to be driven.

Figure 4C:
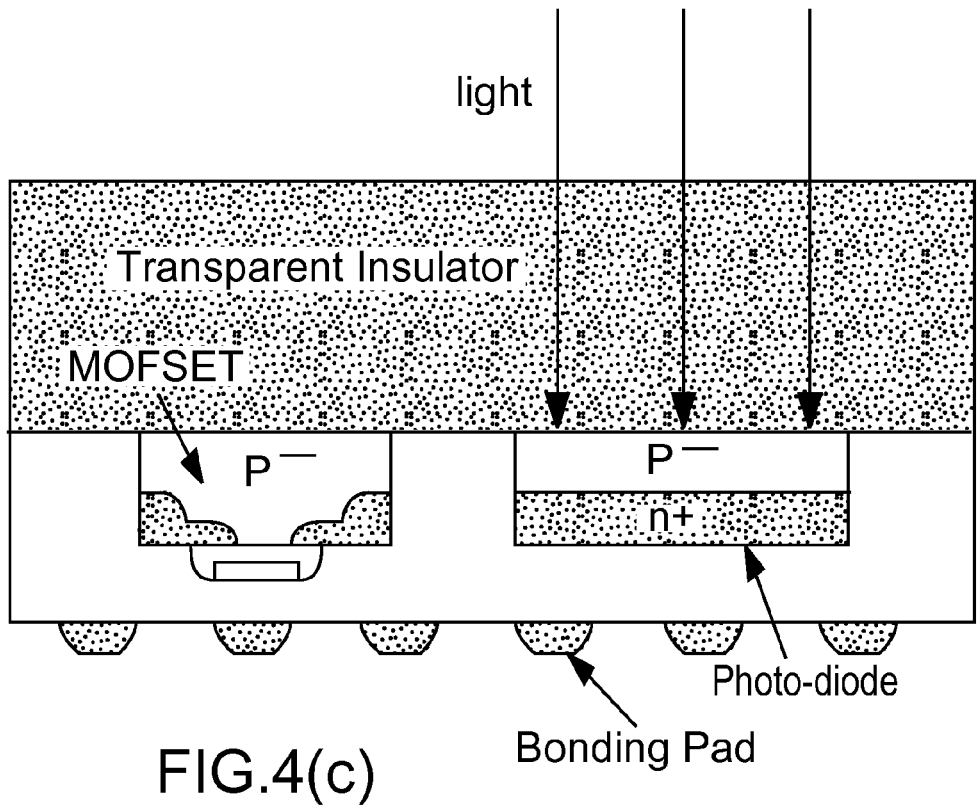
Figure 4D:
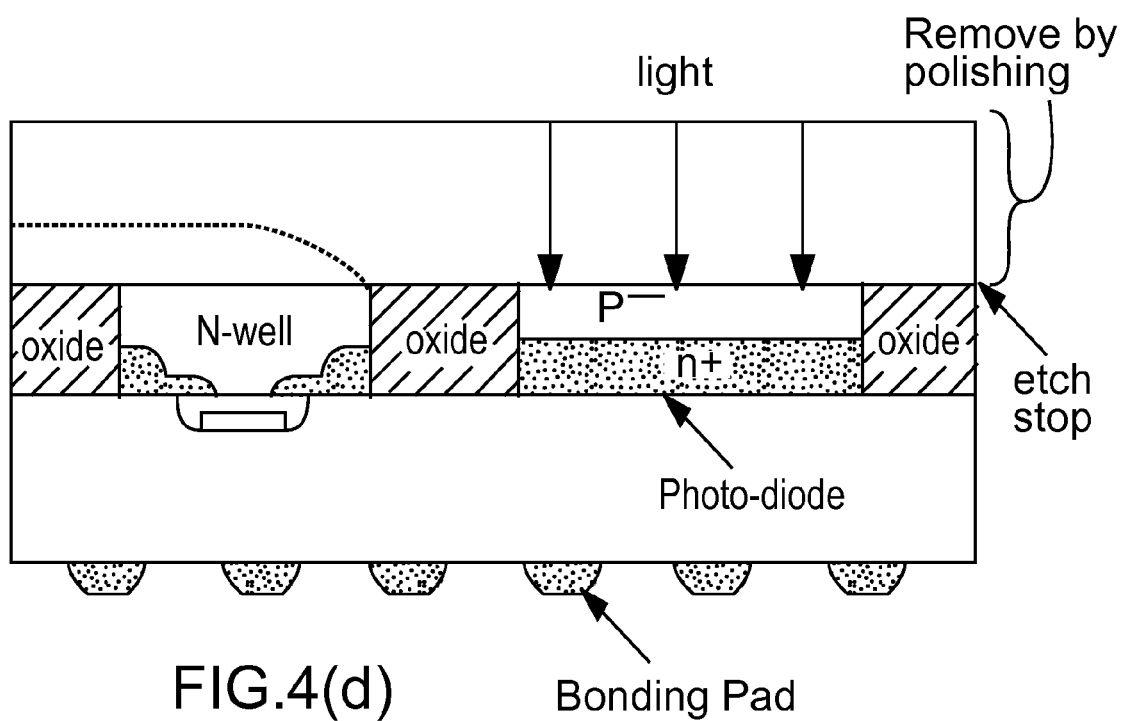

In FIG. 4(a) and FIG. 4(b) light is incident on the top of the sensor. However, light could also be incident from the bottom as shown in FIG. 4(c) in which the active pixel sensor is implemented on a transparent substrate such as sapphire. Alternatively, the back side of the device could be made transparent by forming it to be very thin by polishing as shown in FIG. 4(d).

Figure 5:
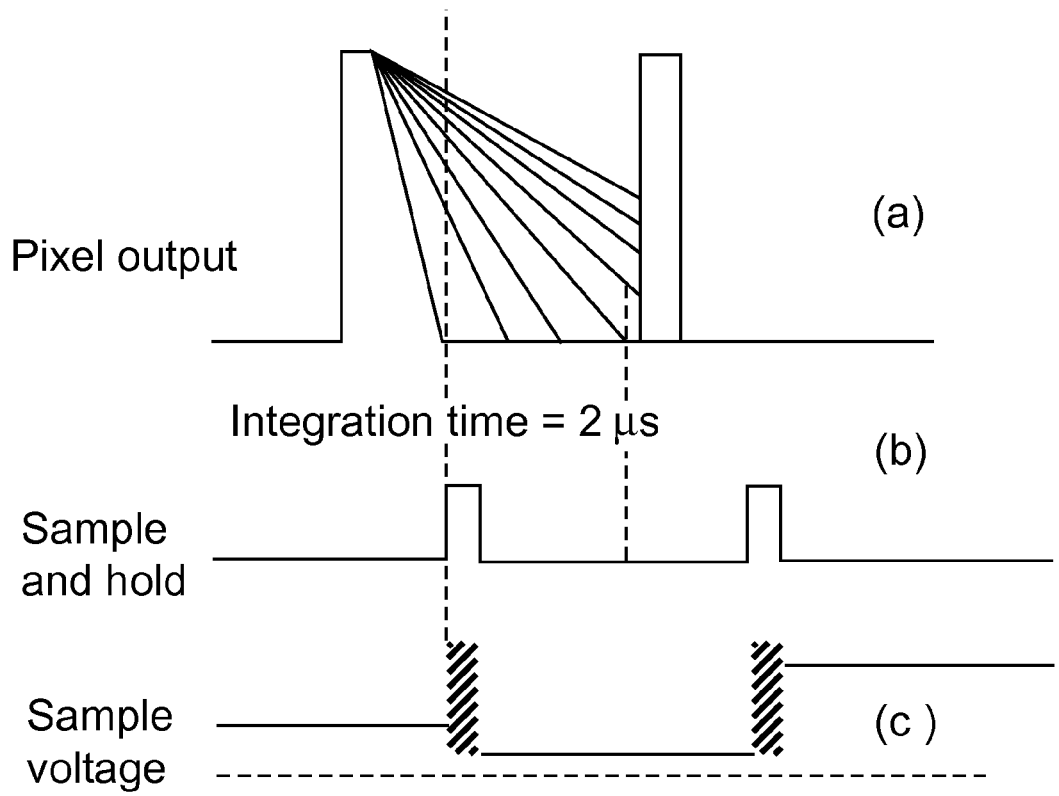
FIG. 5 illustrates a conventional readout methodology.

The voltage output of the active pixel sensor element will have a slope which depends on the illumination intensity with the slope increasing with increasing intensity. The slope, and thus the intensity, may be extracted from the output using known double sampling (DS) or correlated double sampling (CDS) techniques. FIG. 5 illustrates a conventional CDS technique in which the voltage difference is measured over a fixed time interval. A disadvantage with a conventional CDS technique, however, is that it requires an analog-to-digital converter (ADC) capable of a very fine degree of resolution, which is quite difficult to achieve in an ultra low voltage environment. For example, even with an APS according to an embodiment of the invention, at 1V operation the output swing is only 0.55V and to achieve 8-bits resolution the ADC needs to have a resolution of 2 mV. This implies that the practical dynamic range of an APS is governed not only by the APS architecture itself, but also by the readout method.

Figure 6:
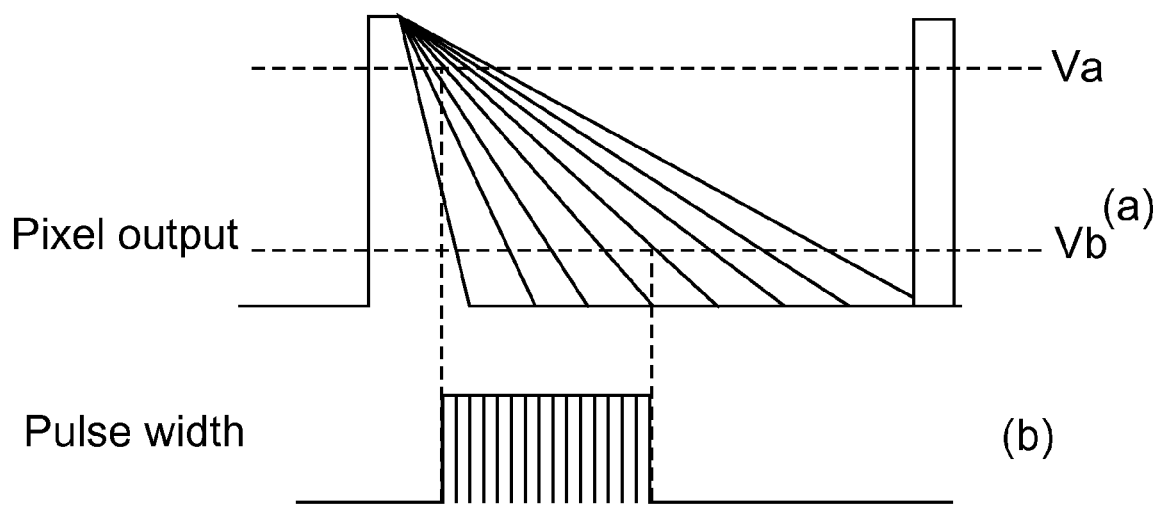
FIG. 6 illustrates a readout methodology according to an embodiment of the invention.

FIG. 6 illustrates a novel readout methodology that may preferably be used in place of a conventional CDS technique. In the method of FIG. 6 two fixed voltages $V_a$ and $V_b$ are defined and the time taken for the pixel output to drop from $V_a$ to $V_b$ is measured. This time is inversely proportional to the illumination intensity. In this method, the dynamic range depends on the conversion speed of the ADC rather than its resolution and this is easier to control with precision, especially in an ultra low voltage environment. This novel methodology is particularly suited for use with CMOS active pixel sensors as described above but could be used with other forms of sensors. The design is particularly suitable for use with sensors capable of use at ultra low voltages (eg below 1V).

It should also be noted that while in the above examples the output voltage will fall at a rate dependent on the incident light intensity, it is also possible to reconfigure the sensor circuit so that the output voltage increases at a rate dependent on the incident light intensity. For example, looking at FIG. 2(a) rather than having the diode connected to ground and the reset transistor to $V_{dd}$, this could be reversed with the reset transistor connected to ground and the diode to $V_{dd}$ as is shown in FIG. 2(c).

The invention claimed is:

1. An image sensor, comprising:
 a pixel element including a photodiode and a reset transistor, wherein:
  the reset transistor and the photodiode are both coupled to an input node;
  the pixel element further includes parallel complementary signal paths and an amplifier configured to combine parallel complementary signals from the parallel complementary signal paths to generate a pixel output;
  one of the parallel complementary signal paths comprises a first source follower;
  another of the parallel complementary signal paths comprises a second source follower;

a gate of the first source follower and a gate of the second source followers are coupled to the input node; and the first source follower has a first conductivity type and the second source follower has a second conductivity type that is different from the first conductivity type.

2. The image sensor of claim 1, wherein the reset transistor comprises a PMOSFET disposed between the input node and ground.

3. The image sensor of claim 2, wherein the reset transistor and the photodiode are each disposed on a thin silicon film on a substrate that is void of a separate well.

4. The image sensor of claim 1, wherein the pixel element further comprises silicon-on-insulator technology.

5. The image sensor of claim 1, wherein the first source follower comprises an NMOS source follower and the second source follower comprises a PMOS source follower.

6. An image sensor, comprising:
a pixel element including;
  a photodiode;
  a reset transistor, wherein the reset transistor and the photodiode are both coupled to an input node;
  a first signal path comprising a first source follower; and
  a second signal path comprising a second source follower, wherein the first and second source followers include gate voltage nodes coupled to the input node, and wherein the first source follower has a first conductivity type and the second source follower has a second conductivity type that is different from the first conductivity type.

7. The image sensor of claim 6, further comprising an amplifier configured to accept a first signal from the first signal path and a second signal from the second signal path, wherein the amplifier is further configured to combine the first signal and the second signal to form a pixel output.

8. The image sensor of claim 6, wherein the reset transistor comprises a PMOSFET coupled to both the input node and ground.

9. The image sensor of claim 6, wherein the reset transistor comprises a NMOSFET coupled to both the input node and a supply voltage.

10. The image sensor of claim 6, wherein the pixel element further comprises silicon-on-insulator technology.

11. The image sensor of claim 6, wherein the reset transistor and the photodiode are each disposed on a thin silicon film on a substrate that is void of a separate well.

12. The image sensor of claim 6, wherein the first source follower comprises an NMOS source follower and the second source follower comprises a PMOS source follower.

13. An apparatus, comprising:
a power supply; and
a pixel sensor array coupled to the power supply and including a plurality of pixel elements, wherein:
  at least one of the pixel elements comprises a photodiode and a reset transistor, wherein the reset transistor and the photodiode are both coupled to an input node;
  the at least one pixel element further includes first and second signal paths coupled to a pixel output node;
  one of the first and second signal paths comprises a first source follower;
  another of the first and second signal paths comprises a second source follower;
  the first and second source followers each have a gate voltage node coupled to the input node; and
  the first source follower has a first conductivity type and the second source follower has a second conductivity type that is different from the first conductivity type.

14. The apparatus of claim 13, wherein the reset transistor comprises a PMOSFET disposed between the input node and ground.

15. The apparatus of claim 13, wherein the apparatus comprises one of a mobile phone or a personal data assistant (PDA) device.

16. The apparatus of claim 13, wherein the first source follower comprises an NMOS source follower and the second source follower comprises a PMOS source follower.

17. An apparatus, comprising:
a power supply; and
a pixel element coupled to the power supply and including a photodiode and a reset transistor, wherein:
  the reset transistor and the photodiode are both coupled to an input node;
  the pixel element further includes parallel complementary signal paths;
  one of the parallel complementary signal paths includes a first source follower;
  another of the parallel complementary signal paths includes a second source follower;
  a gate of the first source follower and a gate of the second source follower are coupled to the input node; and
  the first source follower has a first conductivity type and the second source follower has a second conductivity type that is different from the first conductivity type.

18. The apparatus of claim 17, further comprising an amplifier configured to combine outputs of the parallel complementary signal paths and to form a pixel output based, at least in part, on the combined outputs.

19. The apparatus of claim 17, wherein the reset transistor comprises a PMOSFET disposed between the input node and ground.

20. The apparatus of claim 17, wherein the apparatus comprises one of a mobile phone or a personal data assistant (PDA) device.

21. The apparatus of claim 17, wherein the first source follower comprises an NMOS source follower and the second source follower comprises a PMOS source follower.

* * * * *

UNITED STATES PATENT AND TRADEMARK OFFICE
CERTIFICATE OF CORRECTION

PATENT NO. : 7,897,901 B2  Page 1 of 1
APPLICATION NO. : 12/059402
DATED : March 1, 2011
INVENTOR(S) : Man Sun John Chan et al.

It is certified that error appears in the above-identified patent and that said Letters Patent is hereby corrected as shown below:

Title page column 1, line 2 item (60) under the Related U.S. Application Data section, "which is a division of application No. 10/219,260" should read --which is a continuation-in-part of application No. 10/219,260--

Second page, column 1, line 10 under CROSS REFERENCE TO RELATED APPLICATION, "filed Aug. 16, 2002, the entire disclosure of which is incorporated into the 11/340,676 application by reference." should read --filed Aug. 16, 2002, which is now U.S. Patent 7,005,626, issued Feb. 28, 2006. The entire disclosures of both 11/340,676 and 10/219,260 are incorporated herein by reference.--

Claim 1, column 5, line 2, "source followers" should read --source follower--

Claim 6, column 5, line 18, "a pixel element including;" should read --a pixel element including:--

Signed and Sealed this
Nineteenth Day of July, 2011

David J. Kappos
*Director of the United States Patent and Trademark Office*